United States Patent
Tully et al.

(10) Patent No.: US 7,368,814 B1
(45) Date of Patent: May 6, 2008

(54) SURFACE MOUNT ADAPTER APPARATUS AND METHODS REGARDING SAME

(75) Inventors: Michael J. Tully, Minneapolis, MN (US); Ranjit R. Patil, Eagan, MN (US)

(73) Assignee: Ironwood Electronics, Inc., Eagan, MN (US)

( * ) Notice: Subject to any disclaimer, the term of this patent is extended or adjusted under 35 U.S.C. 154(b) by 426 days.

(21) Appl. No.: 11/088,573

(22) Filed: Mar. 24, 2005

Related U.S. Application Data

(60) Provisional application No. 60/556,983, filed on Mar. 26, 2004.

(51) Int. Cl.
*H01L 23/12* (2006.01)

(52) U.S. Cl. .................. 257/700; 439/66; 361/760
(58) Field of Classification Search ............ 438/257, 438/106–138; 257/700, E23.079; 361/760; 439/66
See application file for complete search history.

(56) References Cited

U.S. PATENT DOCUMENTS

| | | | |
|---|---|---|---|
| 3,971,610 A | 7/1976 | Buchoff et al. | |
| 5,418,471 A | 5/1995 | Kardos | |
| 5,479,319 A * | 12/1995 | Werther | 361/784 |
| 5,645,433 A * | 7/1997 | Johnson | 439/66 |
| 5,691,041 A | 11/1997 | Frankeny et al. | |
| 5,702,255 A * | 12/1997 | Murphy et al. | 439/71 |
| 5,712,768 A | 1/1998 | Werther | |
| 5,742,481 A | 4/1998 | Murphy et al. | |
| 5,770,891 A | 6/1998 | Frankeny et al. | |
| 5,810,607 A | 9/1998 | Shih et al. | |
| 5,876,219 A | 3/1999 | Taylor et al. | |
| 5,892,245 A | 4/1999 | Hilton | |
| 5,982,635 A * | 11/1999 | Menzies et al. | 361/790 |
| 6,007,348 A | 12/1999 | Murphy | |
| 6,325,280 B1 * | 12/2001 | Murphy | 228/246 |
| 6,462,573 B1 * | 10/2002 | McAllister et al. | 324/757 |
| 2003/0032310 A1 * | 2/2003 | Weiss et al. | 439/66 |
| 2004/0242030 A1 * | 12/2004 | Palaniappa et al. | 439/73 |
| 2005/0196979 A1 * | 9/2005 | Fedde et al. | 439/66 |

OTHER PUBLICATIONS

U.S. Appl. No. 11/069,102, filed Mar. 1, 2005, Fedde et al.
"Supermax E-CAD Buried/Blind vias." datasheet [online]. Dansk Data Elektronik A/S , Herlev Hovedgade, 199, DK-2730 Herlev, DENMARK, retrieved on Mar. 23, 2005. Retrieved from the Internet:<URL: www.dde-eda.com/ecadman8/ipl/appendx—10.html>; 2 pgs.
"Ironwood C4882 Drawing", 1 page, provided to customer in Dec. 2002.

* cited by examiner

*Primary Examiner*—Thao X. Le
*Assistant Examiner*—LaTanya Crawford
(74) *Attorney, Agent, or Firm*—Mueting, Raasch & Gebhardt, P.A.

(57) ABSTRACT

An adapter apparatus and methods for using in providing such adapter apparatus include providing a high density interconnect board (e.g., having a pattern of contact pads on a first side thereof corresponding to a packaged device, such as a micro lead frame package) and providing an interconnect device. Interconnect elements extend through a substrate of the interconnect device and are electrically connected to conductive pads on a second side of the high density interconnect board.

11 Claims, 8 Drawing Sheets

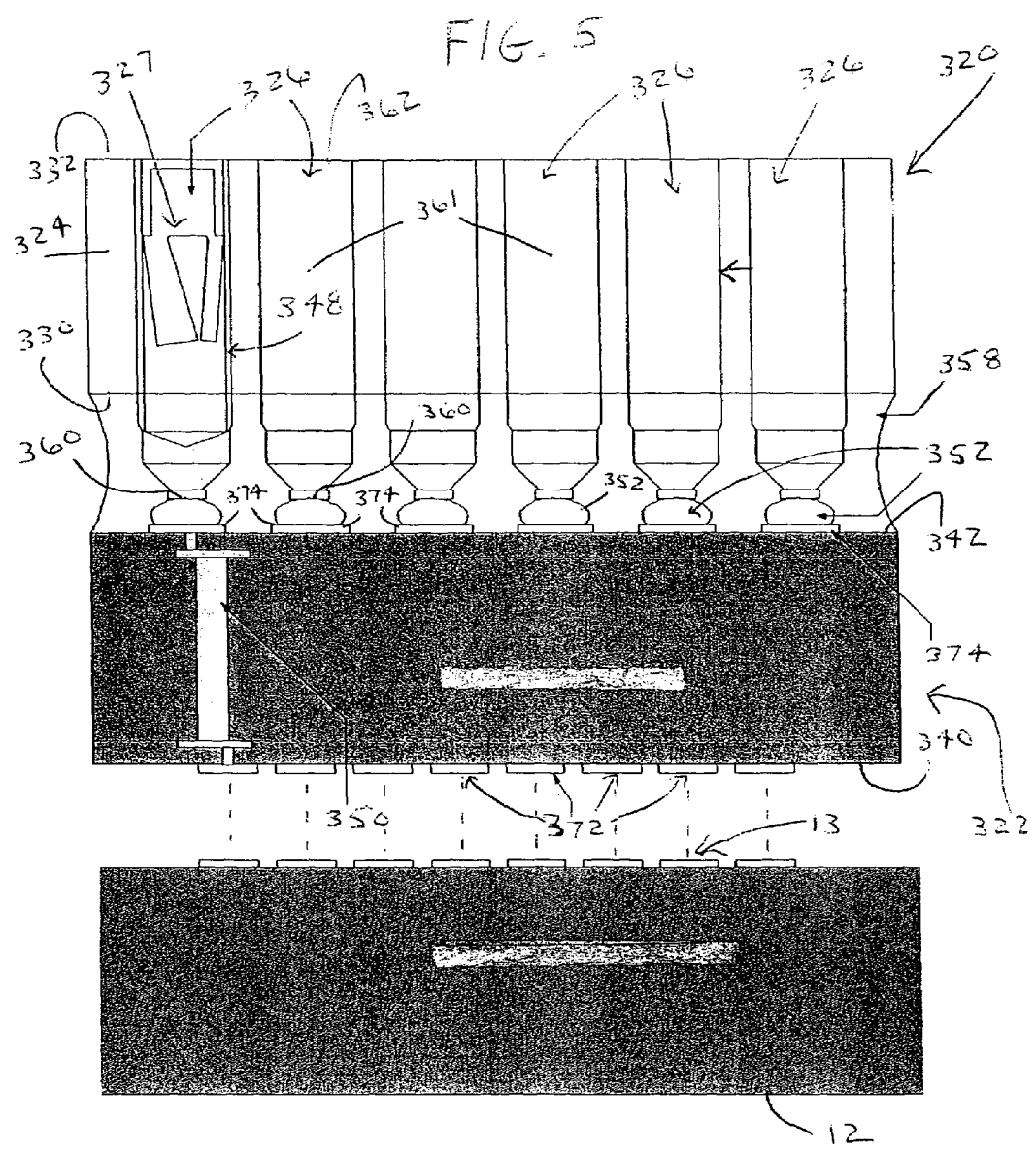

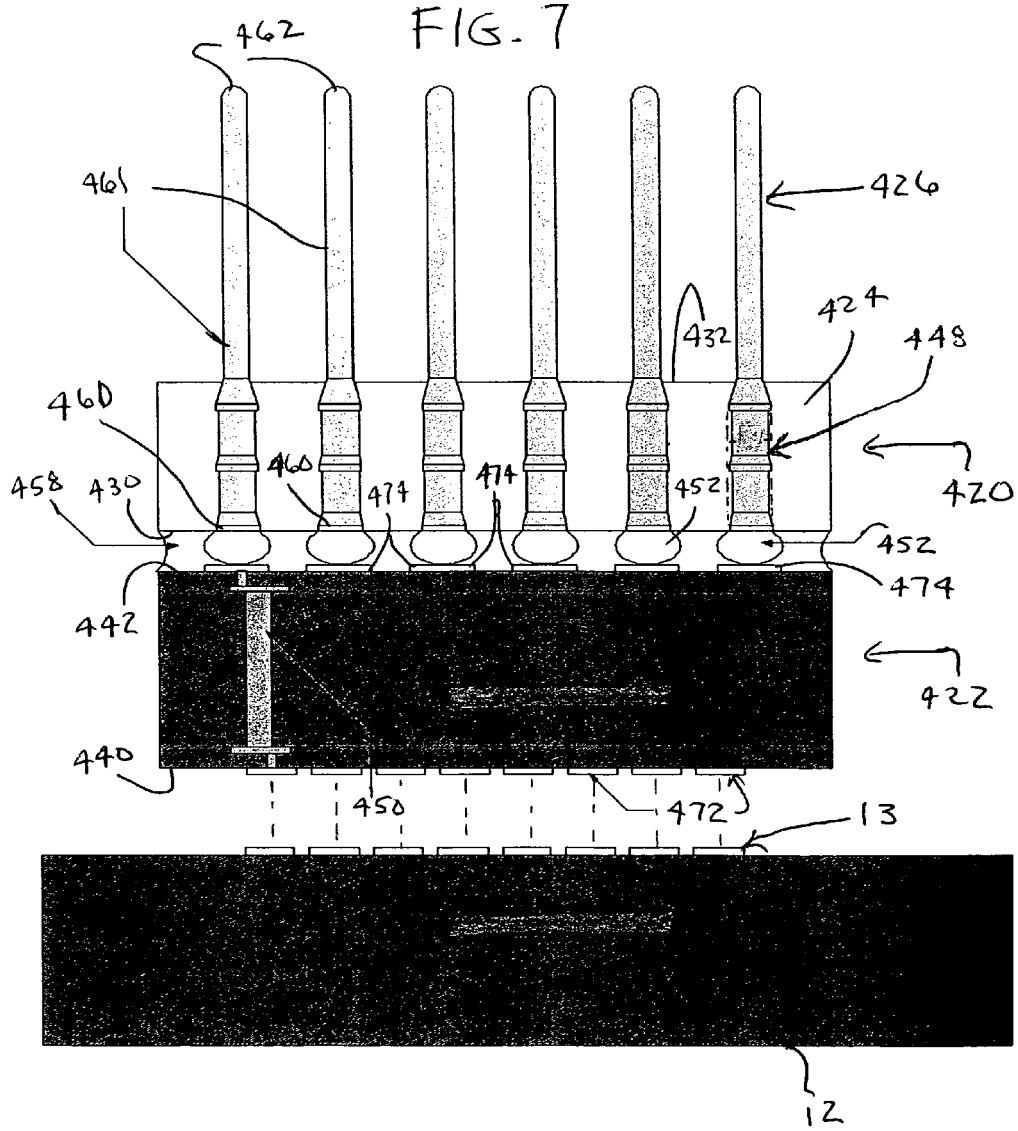

US 7,368,814 B1

SURFACE MOUNT ADAPTER APPARATUS AND METHODS REGARDING SAME

CROSS-REFERENCE TO RELATED APPLICATION

This application claims the benefit of U.S. Provisional Application Ser. No. 60/556,983 filed 26 Mar. 2004, which is incorporated herein by reference in its entirety.

BACKGROUND OF THE INVENTION

The present invention relates generally to adapters for use with packaged devices or other adapter apparatus (e.g., micro lead frame (MLF) devices, chip scale packages (CSP), ball grid array (BGA) packages, land grid array (LGA) or other surface mount devices, male pin adapters, female socket adapter apparatus, etc.).

Certain types of integrated circuit packages are becoming increasingly popular due to their occupancy area efficiency. In other words, they occupy less area on a target board on which they are mounted while providing a high density of contact terminals. For example, one such high density package type is a MLF device.

Generally, such packages contain an integrated circuit having its die bond pads electrically connected to respective conductive surface mount pads that are distributed in a particular configuration on the bottom surface of the package. A target printed circuit board typically has formed on its surface a corresponding configuration of conductive pads which align with the configuration of surface mount pads of the package for electrically mounting the package on the target board. The target board typically includes other conductive traces and elements which lead from the conductive pads used for mounting the package to other circuitry on the target board for connecting various components mounted thereon.

A MLF package is a type of chip scale package (CSP). The die area is a minimum of 80% of the total package area (i.e., the area of the substrate the die is encapsulated in). Further, generally, an MLF package has physical characteristics similar to LGAs, quad flat packages (QFPs), and leadless chip carrier (LCC) type integrated circuit (IC) packages. The MLF package is a leadless design. The interface to the target board is a set of solder pads (e.g., 8-104 pads) on a bottom surface of the package similar to a LGA package. The pads are typically arranged on the perimeter of the package similar to a QFP or LCC type package. MLF packages are generally square or rectangular shaped and have pads along two or four sides of the package on the bottom surface. The pitch between the pads is typically 0.5 mm or less.

Typically, to mount such a package (e.g., MLF package) to a target board, the package is positioned with the configuration of surface mount pads corresponding to the conductive pads on the target board. One or more solder techniques are used (e.g., placement of solder and subsequent heat treatment) to fuse the surface mount pads to the conductive pads of the target board.

Such area efficient packaging (e.g., MLF packages) provide a high density of terminals at a very low cost. Also, this packaging provides for limited lead lengths. Limited lead lengths may reduce the risk of damage to such leads of the package, may provide for higher speed product, etc.

Generally, circuit boards, and/or components mounted thereon, are tested by designers as the circuit boards are being developed. For example, for a designer to test a circuit board and/or a package mounted thereon, the designer must first electrically connect the package to the target circuit board. As described above, this generally includes mounting the package on the target board using a soldering technique to fuse the surface mount pads to the conductive pads of the target board. Therefore, the package may be prevented from being used again.

It is desirable for various reasons to use package adapters for mounting the packages and reuse such packages after testing. For example, such packages may be relatively expensive. Further, for example, once attached, the leads of the package and/or the connection between the surface mount pads of the package and the conductive pads of the target board are not accessible for testing. In addition, it is often difficult to rework the circuit board with packages soldered thereon.

Various adapters which are used for electrically connecting a package to a target printed circuit board are known. For example, U.S. Pat. No. 6,007,348 to Murphy, issued 28 Dec. 1999, entitled "Solder Sphere Terminal," and U.S. Pat. No. 6,325,280 to Murphy, issued 4 Dec. 2001, entitled "Solder Sphere Terminal," describe several adapter apparatus for use in mounting ball grid array packages. For example, as described therein, various intercoupling components are provided. In one of such components, an insulative support member includes a plurality of terminal elements positioned within holes extending through the insulative support member. The terminal elements are sized to be press-fit within the holes of the insulative support member.

To gain access to the signals on a target board through an ICs land pattern (e.g., configuration of surface mount pads), it is generally necessary to attach an adapter to the IC's land pattern. Ideally, the adapter is employed such that each signal is brought out individually to a probe point or some other interface which can be connected to with test clips, cables, connectors, etc. Connecting individual wires to an ICs solder pads (e.g., pads of a MLF device) is impossible in most cases due to density concerns and would be extremely time consuming work by a technician (e.g., such work would need to be done with specialized equipment under a microscope). Further, due the density of the pads and the size of the package (e.g., MLF packages or other chip scale packages), various available adapters (e.g., ball grid array type adapters or those similar thereto) are inadequate to achieve access to the signals.

SUMMARY OF THE INVENTION

According to the present invention, an apparatus, a system or a method provides a user with one or more features for use in gaining access to signals on target boards for probing, testing, or other interconnection purposes, mounting packaged devices, or providing other functionality that should be apparent from the description provided herein. For example, one embodiment of a surface mount adapter apparatus (e.g., an MLF foot) according to the present invention allows interconnection to a surface mount land pattern on a target board through an adapter which emulates the package (e.g., a MLF package). The adapter apparatus may be used for emulation of any surface mount or chip scale package. The adapter apparatus may be easily and quickly soldered to the land pattern using the same techniques employed to solder the actual package (e.g., MLF package).

A surface mount adapter apparatus according to one exemplary embodiment of the present invention includes a high density interconnect board and an interconnect device. The high density interconnect board has first and second sides, and further includes a first plurality of conductive pads configured on the first side of the high density interconnect board electrically connected (e.g., using blind and buried vias) with a second plurality of conductive pads configured on the second side of the high density interconnect board. The first plurality of conductive pads are configured for connection to a pattern of conductive pads of a target board (i.e., the pattern of the conductive pads of the target board are configured to receive a packaged device, such as a micro lead frame package or any other chip scale package).

The interconnect device of the surface mount adapter apparatus includes a substrate having first and second sides and a plurality of interconnect elements extending through the substrate. Each of the plurality of interconnect elements includes at least a first end and a second end. The interconnect device is electrically connected (e.g., a reflowed solder connection, conductive epoxy, etc.) to the high density interconnect board with the second side of the high density interconnect board adjacent the first side of the interconnect device. The first end of each of one or more of the plurality of interconnect elements is electrically connected to one of the second plurality of conductive pads on the second side of the high density interconnect board. The high density interconnect board and the interconnect device are configured to have a footprint substantially the same as the packaged device (e.g., a micro lead frame package or any other chip scale package).

In one embodiment of the surface mount adapter apparatus, one or more of the plurality of interconnect elements (e.g., female socket pins, male terminal pins, or conductive elements comprising two ends configured to receive solder material on at least one of the ends) extending through the substrate of the interconnect device may be press-fit into a corresponding opening defined through the substrate of the interconnect device, or in another embodiment, one or more of the plurality of interconnect elements may be mounted within a corresponding opening defined through the substrate of the interconnect device using a curable material.

In another embodiment of the surface mount adapter apparatus, the first plurality of conductive pads of the high density interconnect board are electrically connected with the second plurality of conductive pads of the high density interconnect board using blind and buried micro-vias.

In yet another embodiment of the surface mount adapter apparatus, an encapsulant may be provided between the second side of the high density interconnect board and the first side of the interconnect device.

Still further, a carrier adapter may be configured for connection via the seconds ends of the plurality of interconnect elements to the surface mount adapter apparatus. The carrier adapter is used to connect a micro lead frame package or any other chip scale package to the surface mount adapter apparatus.

A method for use in forming a surface mount adapter apparatus is also provided according to the present invention. The method includes providing a high density interconnect board having first and second sides. The high density interconnect board further includes a first plurality of conductive pads configured on the first side of the high density interconnect board electrically connected (e.g., using blind and buried vias) with a second plurality of conductive pads configured on the second side of the high density interconnect board. The first plurality of conductive pads are configured for connection to a pattern of conductive pads of a target board with the pattern of the conductive pads of the target board configured to receive a packaged device (i.e., the pattern of the conductive pads of the target board are configured to receive a packaged device, such as a micro lead frame package or any other chip scale package).

The method further includes providing an interconnect device including a substrate having first and second sides and a plurality of interconnect elements (e.g., female socket pins, male terminal pins, or conductive elements comprising two ends configured to receive solder material on at least one of the ends) extending through the substrate. Each of the plurality of interconnect elements includes at least a first end and a second end. The second side of the high density interconnect board is positioned adjacent the first side of the interconnect device and the first end of each of one or more of the plurality of interconnect elements is electrically connected (e.g., a reflowed solder connection, conductive epoxy, etc.) to one of the second plurality of conductive pads on the second side of the high density interconnect board.

In one embodiment of the method, an encapsulant is provided between the second side of the high density interconnect board and the first side of the interconnect device.

In another embodiment of the method, the method further includes mounting the surface mount adapter apparatus to the target board by connecting the first plurality of conductive pads of the high density interconnect board to the pattern of conductive pads of the target board. A carrier adapter is connected to the surface mount adapter apparatus using the second ends of the interconnect elements (i.e., the carrier adapter being configured for use with the packaged device).

In another embodiment of the method, electrically connecting the first end of each of one or more of the plurality of interconnect elements to one of the second plurality of conductive pads on the second side of the high density interconnect board includes placing solder material on the second plurality of conductive pads on the second side of the high density interconnect board. The second side of the high density interconnect board is positioned adjacent the first side of the interconnect device with the first end of the plurality of interconnect elements in contact with the second plurality of conductive pads on the second side of the high density interconnect board. Thereafter, at least the solder material is thermally treated to connect the firsts ends of the plurality of interconnect elements to the second plurality of conductive pads on the second side of the high density interconnect board. Further, the method may include providing an encapsulant between the second side of the high density interconnect board and the first side of the interconnect device and surrounding the connection of the firsts ends of the plurality of interconnect elements to the second plurality of conductive pads on the second side of the high density interconnect board.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

FIG. 5 shows a more detailed diagrammatic cross-sectional view of the surface mount adapter apparatus shown in FIGS. 4A-4D as well as a target board to which it can be mounted.

FIG. 7 shows a more detailed diagrammatic cross-sectional view of the surface mount adapter apparatus shown in FIGS. 6A-6C as well as a target board to which it can be mounted.

DETAILED DESCRIPTION OF THE EMBODIMENTS

The present invention shall generally be described with reference to FIGS. 1-3. A more detailed description of one or more various embodiments of the present invention shall then be described with reference to FIGS. 4-7. It will be apparent to one skilled in the art that elements from one embodiment may be used in combination with elements of the other embodiments, and that the present invention is not limited to the specific embodiments described. Further, it will be recognized that the embodiments of the present invention described herein will include many elements that are not necessarily shown to scale. Further, it will be recognized that the size and shape of various elements herein may be modified without departing from the scope of the present invention, although one or more shapes and sizes may be advantageous over others.

Figure 1:
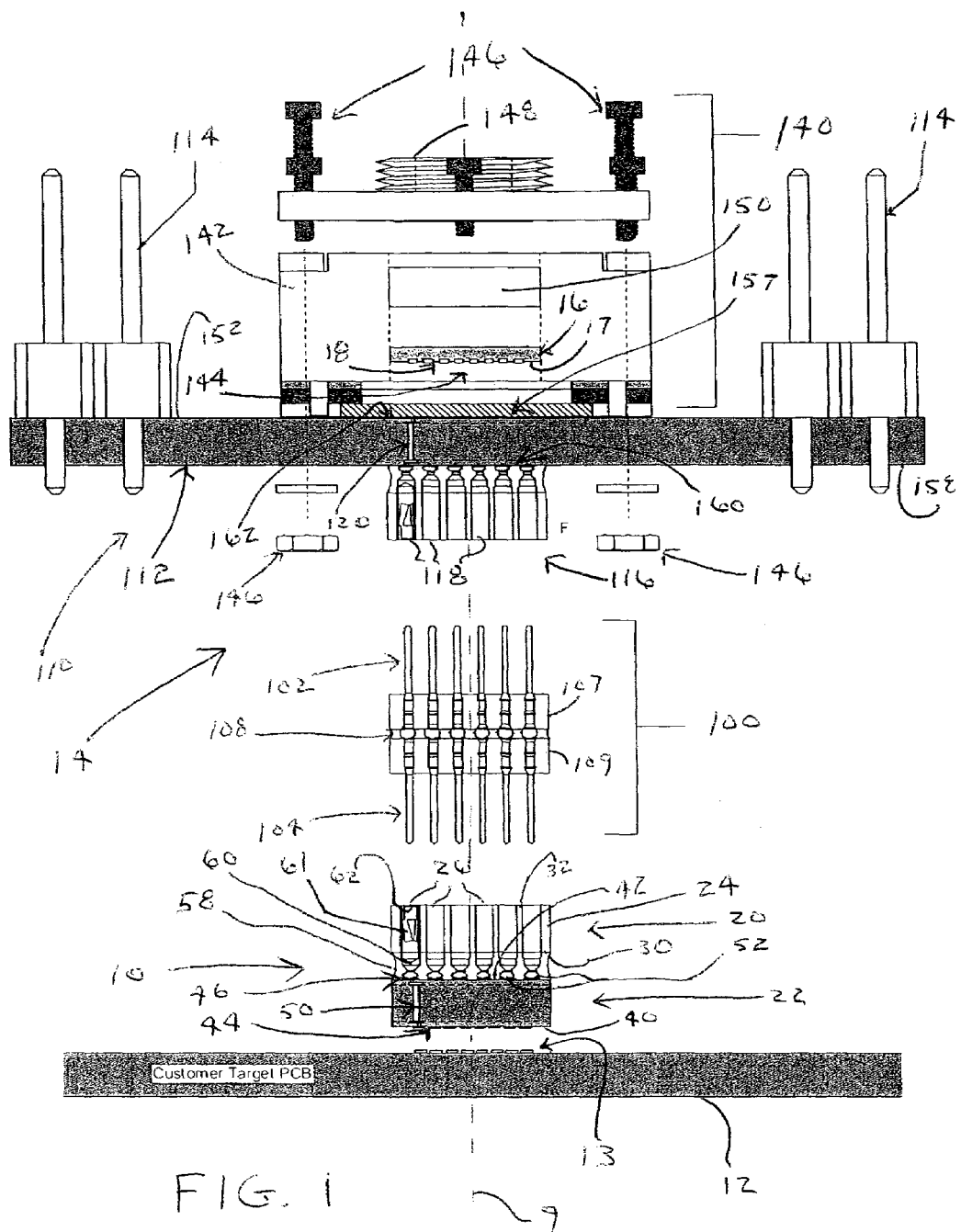
FIG. 1 is a generalized illustrative diagram of one exemplary embodiment of a surface mount adapter apparatus (e.g., including a high density interconnect board and an interconnect device) according to the present invention for use with a carrier adapter to mount a packaged device (e.g., MLF package) relative to a target board.
Figure 2:
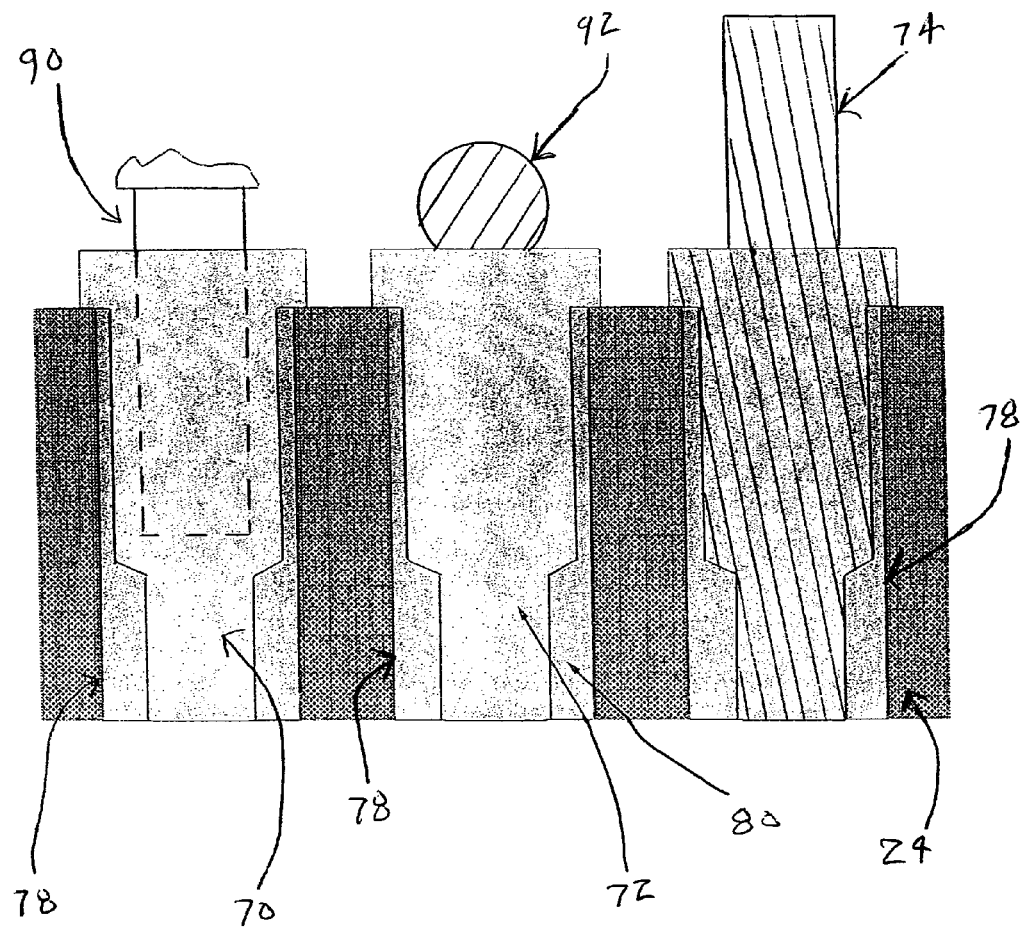
FIG. 2 is a generalized diagrammatic view of a portion of an interconnect device of a surface mount adapter apparatus such as shown in FIG. 1 including a plurality of interconnect elements for use in illustrating various types of conductive interconnect elements that may be mounted in openings formed through a substrate of the interconnect device.

FIG. 1 shows a generalized diagrammatic view of a surface mount adapter apparatus 10 mountable on an exemplary target board 12 and configured for receiving a carrier adapter 14, and/or portions thereof. The carrier adapter 14 is used to connect a packaged device 16 (e.g., an MLF device and/or any other chip scale package) having a plurality of conductive pads 18 on a surface (e.g., bottom surface 17) thereof.

The surface mount adapter apparatus 10 includes a high density interconnect board 22 and an interconnect device 20. The high density interconnect board 22 includes a first side 40 and a second side 42 opposite the first side 40. The high density interconnect board 22 further includes a first plurality of conductive pads 44 configured on the first side 40 of the high density interconnect board 22 electrically connected with a second plurality of conductive pads 46 configured on the second side 42 of the high density interconnect board 22. The first plurality of conductive pads 44 are configured for connection to a pattern of conductive pads 13 of the target board 12.

The pattern of conductive pads 13 on the target board 12 are configured to receive a packaged device 16 thereon. For example, the pattern of conductive pads 13 may be configured for mounting various types of packaged devices, including, but not limited to, for example, surface mount devices, such as ball grid array packages, land grid array (LGA) packages, micro-lead frame (MLF) devices, column grid array packages, non-solder ball packages, other packaged devices with surface mount pads, etc. One will recognize that the surface mount adapter apparatus 10 will be different depending on the type of packaged device 16 being mounted (e.g., the surface mount apparatus 10 including a different conductive pad configuration and/or other different electrical connections used therein).

Preferably, according to the present invention, the surface mount adapter apparatus 10 is used to mount MLF devices and/or any other chip scale packages. As described in the Background of the Invention section, a chip scale package is a package that has a die area that is a minimum of 80% of the total package area (e.g., the area of the substrate the die is encapsulated in). Further, in one embodiment, the pitch between the pads of an MLF package mounted according to the present invention is typically about 0.8 mm or less. In yet another embodiment, the pitch between the pads of an MLF package mounted according to the present invention is typically about 0.5 mm or less.

The interconnect device 20 of the surface mount adapter apparatus 10 comprises a substrate 24 having a first side 30 and a second side 32 opposite thereof. A plurality of interconnect elements 26 extend through the substrate 24. Each of the plurality of interconnect elements 26 include a body 61 extending between a first end 60 and a second end 62.

The interconnect device 20 is electrically connected to the high density interconnect board 22 with the second side 42 of the high density interconnect board 22 adjacent the first side 30 of the interconnect device 20. Preferably, the sides are orthogonal to axis 9, which axis 9 is generally orthogonal to target board 12 (e.g., the carrier adapter 14, surface mount adapter apparatus 10, and components thereof, extending along axis 9). The first end 60 of each of one or more plurality of interconnect elements 26 are electrically connected to one of the second plurality of conductive pads 46 on the second side 42 of the high density interconnect board 22.

With the interconnect device 20 electrically connected to the high density interconnect board 22, the surface mount adapter apparatus 10 may be mounted (e.g., by electrically connecting the conductive pads 44 on the first side of the high density interconnect board 22 to the conductive pads 13 of the target board 12) to the target board 12. As mounted, the surface mount adapter apparatus 10 may receive one or more portions of the carrier adapter 14 for use in mounting packaged device 16. For further structural integrity and isolation of the conductive interconnect elements 26, an encapsulant 58 is provided between the second side 42 of the high density interconnect board 22 and the first side 30 of the interconnect device 20.

The high density interconnect board 22 and the interconnect device 20 are configured to have a footprint substantially the same as the packaged device 16. As used herein, the term "footprint" refers to the surface area of the target board occupied by the packaged device 16 and/or the surface mount adapter apparatus 10. For example, a square packaged device having a length and width of 5.25 mm will have a footprint of $(5.25 \text{ mm})^2$.

As used herein, the term "substantially the same" used in conjunction with the term footprint shall refer to dimensional characteristics within ±10%. For example, if a packaged device having a footprint of $(5.25 \text{ mm})^2$ is being mounted using the surface mount adapter apparatus 10, according to the present invention, the high density interconnect board 22 and the interconnect device 20 shall be configured to have a footprint of $(5.25 \text{ mm})^2 \pm 10\%$.

One will recognize that the footprint of the surface mount adapter apparatus 10 may vary based on the application of the adapter apparatus 10. For example, the surface mount adapter apparatus 10 may be configured to mount more than one packaged device. As such, as used herein, when the term "packaged device" is used, it may refer to more than one package. Likewise, when a singular term is used for one or more other components herein, such components may include more than one.

The high density interconnect board 22 may be any suitable high density interconnect board for providing the interconnection between conductive pads 44 on the first side 40 (e.g., which generally have the same configuration as the conductive pads 18 of the packaged device 16 to be mounted using the surface mount adapter apparatus 10) and the conductive pads 46 on the second side 42 of the high density interconnect board 22. Such conductive pads 46 will generally take a different configuration than the conductive pads 44 on the first side of the high density interconnect board 22. In other words, the conductive pads 46 will be distributed differently on the second side 42 of the high density interconnect board 22 than the conductive pads 44 on the first side of the high density interconnect board 22. Such distribution of the conductive pads 46 allow for connection to the conductive elements 26 of the interconnect device 20.

In one embodiment, the high density interconnect board 22 may be a multi-layered printed circuit board which uses blind and buried vias 50 (only a single via shown for simplicity), such as, for example, blind and buried micro-vias, to connect the conductive pads 44 and conductive pads 46 on opposite sides of the printed circuit board. Blind vias are generally vias having a connection to the surface of a printed circuit board, but not going through all the layers thereof. Further, buried vias go through one or more layers of the printed circuit board, but without connection to the surface thereof. This is in contrast to normal vias which generally go through all the layers of the printed circuit board. Further, generally, micro-vias (e.g., small plated holes) are holes that are about 5 mils or less in diameter and about 5 mils or less in depth. Typically, micro-vias are created using lasers (e.g., to control depth) as opposed to mechanical drills.

Generally, the high density interconnect board 22 is formed of any suitable insulative materials (e.g., polyimide materials). Preferably, the high density interconnect board 22 is formed of a high temperature material (e.g., a material that is suitable for use in temperatures that exceed 125° C. or that exceed PCB assembly reflow temperatures, such as materials that are exposed to temperatures that exceed 200° C. for a time period of 10 seconds to 30 seconds). For example, the high density interconnect board may be formed of one or more materials such as FR4/G10, Kapton, or Rogers R04350.

The substrate 24 of the interconnect device 20 also may be formed of any suitable insulative materials (e.g., polyimide materials). Preferably, the substrate 24 is formed of a high temperature material (e.g., a material that is suitable for use in temperatures that exceed 125° C. or that exceed PCB assembly reflow temperatures, such as materials that are exposed to temperatures that exceed 200° C. for a time period of 10 seconds to 30 seconds). For example, the substrate 24 may be formed of one or more materials such as FR4/G10, Kapton, or Rogers R04350.

Openings in the substrate 24 are defined in which the interconnect elements 26 are mounted. The interconnect elements 26 may be mounted in the openings defined in substrate 24 by any suitable technique. For example, the interconnect elements 26 may be press-fit within the defined openings in the substrate 24. Further, the conductive elements 26 may be mounted within the defined openings of the substrate 24 using a curable material, such as described in U.S. patent application Ser. No. 11/069,102, entitled, "Adapter apparatus with conductive elements mounted using curable material and methods regarding same," filed 1 March 2005, which is incorporated by reference herein.

The mounting of the interconnect elements 26 within the defined openings in the substrate 24 is performed such that the first end 60 of the interconnect elements 26 are accessible at the first side 30 of the interconnect device 20. Likewise, the second ends 62 of the interconnect elements 26 are accessible at the second side 32 of the interconnect device 20 when the interconnect elements 26 are mounted within the openings defined in substrate 24.

The conductive interconnect elements 26, as shown in FIG. 1, include female socket pins mounted in corresponding openings defined through the substrate 24. However, as shown in FIG. 2, the interconnect elements may include any type of terminal configuration mounted with openings 78 of the substrate 24. For example, as shown in FIG. 2, the conductive interconnect elements may include a female socket pin 70 (e.g., like that shown in FIG. 1) for mating with a male terminal pin 90, or may include a male terminal pin 74 (e.g., like that shown in FIGS. 6-7) for mating with a female socket. In addition, the conductive interconnect element may even include a conductive element that has both first and second ends configured to receive solder material 92 on at least one or both of the ends (e.g., solder material on both ends, solder material on one end and a solder film on another, etc.), as shown by conductive element 72 in FIG. 2. For example, the conductive interconnect element 72 may be a conductive plug (e.g., an element that does not include either a female contact or a male contact at either end) mounted in opening 78 (e.g., using a curable material 80 or press fit therein) that has solder material attached to one or both of the respective ends thereof. However, the conductive interconnect elements may have other solder materials provided thereon, or may not require any solder material on the ends at all. In other words, the type of conductive element mounted in the openings defined in substrate 24 according to the present invention will depend upon the particular application to be accomplished with the surface mount adapter apparatus 10.

For example, as shown in FIG. 1, and not to be considered limiting to the present invention, the surface mount adapter apparatus 10 is employed as a MLF surface mount emulator foot adapter to mount a packaged device 16 (e.g., a MLF package) to target board 12. Target board 12 includes the pattern of contact elements or pads 13 corresponding to the configuration of contact pads 18 on lower surface 17 of MLF device 16. The MLF device 16 is received within carrier adapter 14 which may be pluggable onto surface mount adapter apparatus 10.

Although carrier adapter 14 may include one of any number of different configurations (e.g., carrier adapter assemblies including a test/probe structure), FIG. 1 provides one exemplary embodiment of such a carrier adapter. The carrier adapter 14 shown in FIG. 1 includes a socket apparatus 140 (e.g., a high speed MLF socket such as a GHz socket that receives a MLF package) and a test/probe assembly 110.

The test/probe assembly 110 includes a probing board 112 which routes female socket connector 116 on the bottom of the test/probe assembly 110 to pads 162 on the upper surface 152 corresponding to the pads 18 on the lower surface 17 of the packaged device 16 (e.g., a MLF device). The conductive pads 162 on the probing board 112 also route to test points 114 on the perimeter of the probing board 112.

The female socket connector 116 includes a plurality of female socket elements 118 generally corresponding to the socket configuration or conductive interconnect elements 26 of the interconnect device 20 of the surface mount adapter apparatus 10. The conductive female socket elements 118 of the female socket connector 116 are electrically connected to the contact pads 160 on the lower surface 158 of probing board 112 which are routed (e.g., via conductive traces, vias, etc.) shown generally by numeral 120 to the conductive pads 162 corresponding to the contact pads 18 of the packaged device 16.

The socket 140 is mounted to the probing board 112 using mounting hardware 146. One will recognize that any such hardware may be used to provide such mounting and that any suitable socket may be employed. The socket 140 defines a cavity 144 within a body 142 of the socket 140 for receiving the packaged device 16 adjacent a pattern of conductive elements 157 (e.g., a conductive elastomer) for providing electrical connection between the packaged device 16 and the conductive pads 162 on probing board 112. A screw 148 for contacting compression plate 150 and providing a force upon packaged device 16 to provide for effective contact between the conductive pads 18 of the packaged device 16 and the conductive elements 157 is also provided.

The carrier adapter 14 further includes a male-to-male interface connector 100 for coupling the female socket connector 116 to the female socket or interconnect elements 26 of the interconnect device 20. The male/male interface connector 100 includes a first set of male pins 102 configured for mounting within female socket connector 116 and a second set of male pins 104 configured for pluggable connection to interconnect elements 26 of interconnect device 20. The male pins 102 and 104 are inserted or mounted within substrates 107, 109, respectively, and electrically connected to one another, for example, by a reflowed solder connection 108 (e.g., reflowed solder balls or spheres). One skilled in the art will recognize from the description herein that the male/male connector may be provided in one or more various configurations (e.g., a double-ended male pin inserted in a single substrate).

In other words, as the surface mount adapter apparatus 10 includes female socket pins as the interconnect elements 26, a male pin adapter 100 is used for mounting the carrier adapter 14. However, if the adapter apparatus 10 included a plurality of male terminal pins, such as male terminal pins 426 shown in FIGS. 6-7, a female adapter, such as female socket connector 116, may be employed for use in mounting the carrier adapter as opposed to the male pin adapter 100.

It will be recognized that any carrier adapter apparatus may be used in combination with the surface mount adapter apparatus 10 for mounting one or more packaged devices. The exemplary configuration of carrier adapter 14 is not to be taken as limiting on the configuration thereof. In other words, any number of carrier adapter configurations may be employed according to the present invention.

In one embodiment of the surface mount adapter apparatus 10, the foot adapter allows interconnection to the surface mount land pattern 13 on the target board 12 through the adapter apparatus 10 that emulates a MLF package (or, for example, any other surface mount or chip scale packages). The MLF foot adapter apparatus 10 is easily and quickly soldered to the land pattern using the same techniques employed to solder the actual MLF package 16. The MLF foot adapter apparatus 10 includes the surface mount pads 44 on the target board side and a set of interconnect pins 26 on the opposite side. The interconnect pins 26 on the top of the foot adapter 10 can interconnect to various assemblies with a connector of the opposite sex. Generally, each MLF pad 44 on the bottom of the high density interconnect device 22 is routed to a single interconnect element 26 accessible at the top of the MLF foot adapter apparatus 10.

Further, in one embodiment of the foot adapter apparatus 10, the high density interconnect board 22 (e.g., with blind and buried micro vias) routes from the interconnect elements 26 to the bottom pads 44 which connect to the target board 12. The interconnect device 20, or high density receptacle, is connected (e.g., reflowed or connected using a conductive epoxy) to the top of the high density interconnect board 22. Generally, the footprint of the interconnect device is smaller than the package (e.g., the MLF package it is emulating) so that the high density interconnect board 22 can maintain a size substantially the same as the package intended for the target board pattern of conductive elements 13. The interconnect elements 26 (e.g., receptacle pins) are retained in the substrate 24 to keep them on the same centers as their corresponding soldering pads 46 on the high density interconnect board 22. As previously described, encapsulant 58 may be used between the high density interconnect board 22 and the interconnect device 20 to keep contaminants out of the interface between the interconnect elements 26 and the conductive pads 46 on the high density interconnect board 22.

One will recognize that any number of designed adapters may be connected to the interconnect elements 26 when the foot adapter 10 is used (e.g., a carrier adapter as further described herein, a carrier assembly that has a socket on top for receiving the actual MLF package and a set of male pins on the bottom which would plug onto the foot, a foot with female pins extending through the substrate, etc.).

Further, the interconnect elements 26 (e.g., receptacles) could be probed with high density flying lead-type probes, or any other suitable testing devices. The conductive interconnect elements 26, as generally shown in FIG. 1, as well as any other conductive interconnect elements which may be mounted in openings defined through substrate 24 (e.g., see conductive elements of FIG. 2), may be formed of any suitable conductive material. For example, such conductive elements may be formed of brass alloy, gold, nickel, beryllium, or copper alloy. Yet further, various types of contact structures may be employed, as well as various different material types for such contact structures as would be known in the art.

Figure 3:
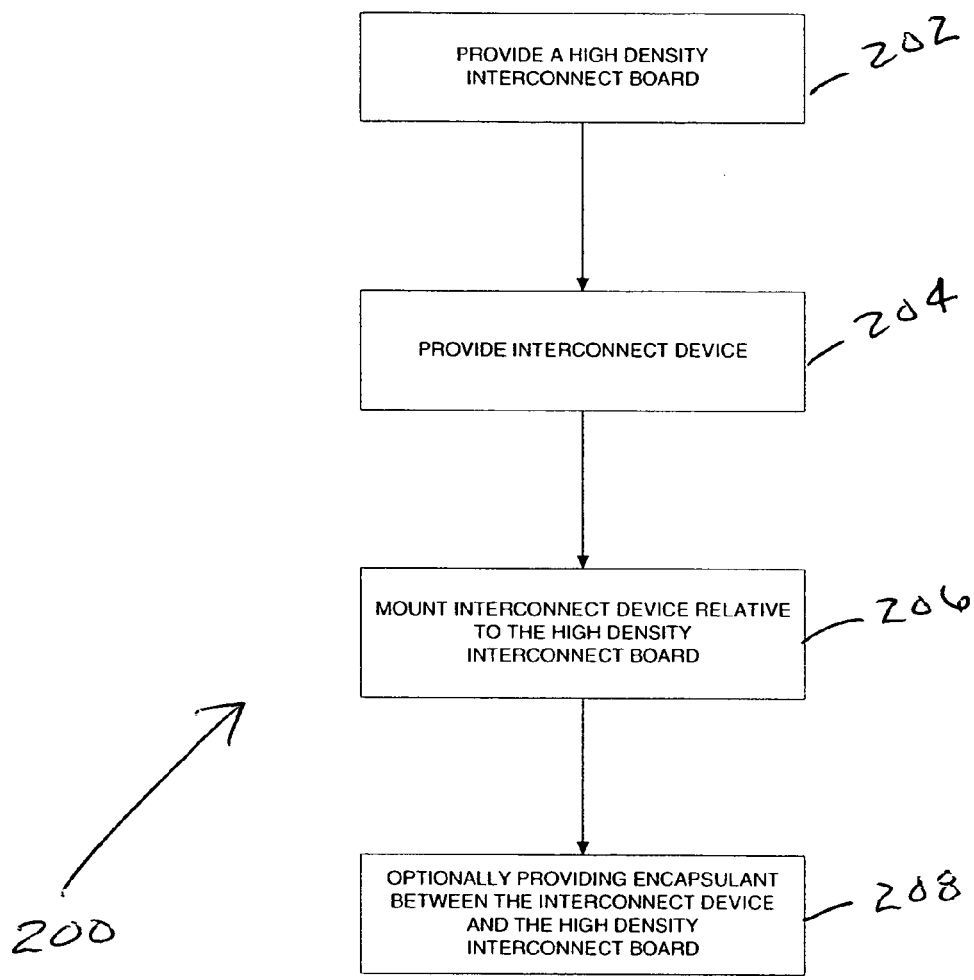
FIG. 3 is a block diagram showing one generalized embodiment of a method for providing a surface mount adapter apparatus such as that shown generally in FIG. 1.
Figure 4B:
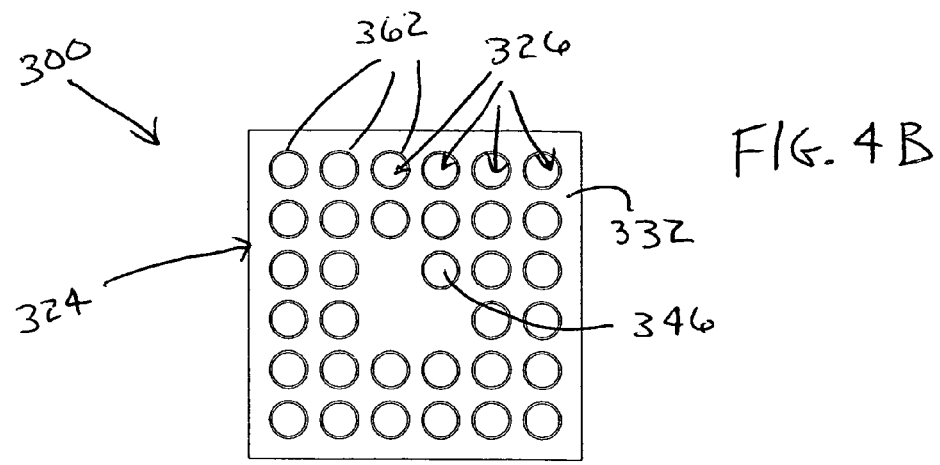
FIGS. 4A-4D show a partial cut-away side view, a top view, a side view, and a bottom view, respectively, of one exemplary embodiment of a surface mount adapter apparatus according to the present invention.
Figure 4A:
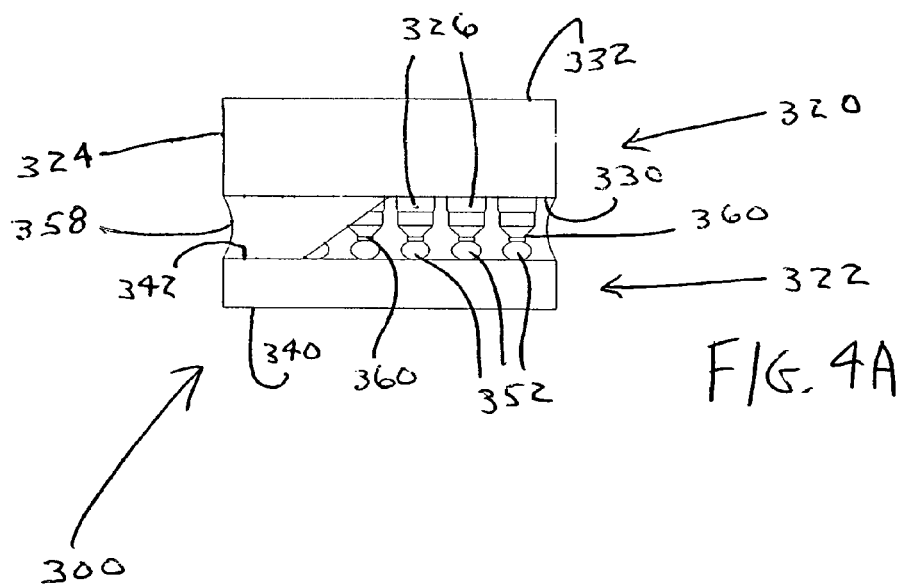
Figure 4D:
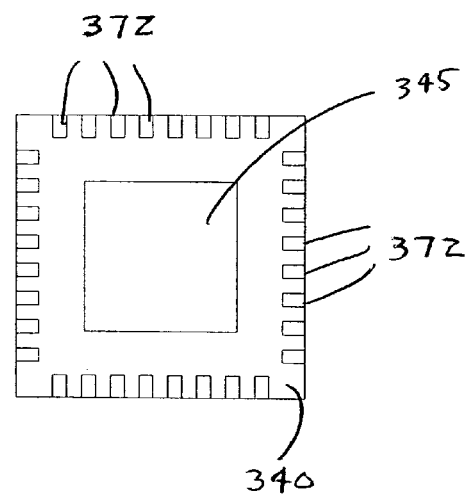
Figure 4C:
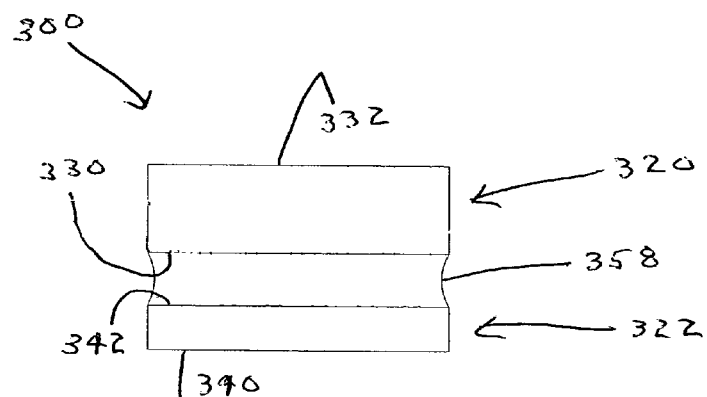

FIG. 3 provides a block diagram of a method 200 for providing a surface mount adapter apparatus 10 such as that shown generally in FIG. 1. The method 200 includes providing a high density interconnect board 22 (block 202), such as that described with reference to FIG. 1. For example, the high density interconnect board 22 may be a printed circuit board that connects a first plurality of conductive pads 44 configured on a first side 40 of the high density interconnect board 22 with a second plurality of conductive pads 46 configured on a second opposite side 42 of the high density interconnect board 22 using blind and buried vias 50 (e.g., micro-vias).

The method 200 further includes providing an interconnect device 20 (block 204), such as that shown generally in FIG. 1. For example, the interconnect device 20 may include a substrate 24 having first and second sides 30, 32 and a plurality of interconnect elements 26 extending through the substrate 24. Each of the plurality of interconnect elements 26 include at least a first and second end 60, 62. The second side 42 of the high density interconnect board 22 is positioned adjacent the first side 30 of the interconnect device 20. The first end 60 of each of one or more of the plurality of interconnect elements 26 are then electrically connected to a corresponding pad of the second plurality of conductive pads 46 on the second side 42 of the high density interconnect board 22 to mount the interconnect device 20 relative to the high density interconnect board 22 (block 206).

Such electrical connection may be performed using any suitable technique. For example, the electrical connection between the first ends 60 of the interconnect elements 26 and the conductive pads 46 on the second side 42 of the high density interconnect board 22 may be performed using a conductive epoxy, may be performed using a reflowed solder connection, may be performed using a reflowed solder ball configuration, etc.

In one embodiment of the present invention, solder material (e.g., solder balls 52) are positioned on conductive pads 46 of the high density interconnect board 22. The interconnect device 20 is then positioned such that the interconnect elements 26 thereof are positioned on the solder material 52. Thereafter, the solder material is reflowed to provide the connection between the interconnect device 20 and the high density interconnect board 22.

Further, as shown in FIG. 3, the method 200 may optionally include providing an encapsulant 58 between the interconnect device 20 and the high density interconnect board 22 (block 208). Any suitable method of providing such an encapsulant between the components may be used. For example, in one embodiment, an epoxy is provided using a syringe. The epoxy is provided to the volume between the interconnect device 20 and the high density interconnect board 22 and about the interconnections between the conductive interconnect elements 26 and conductive pads 46 on the high density interconnect board 22. Any suitable device, such as a flexible scraper, may be used to remove any excess encapsulant 58.

Solder material 52 may include any suitable type of solder material generally known in the art. For example, the solder material 52 may include solder balls (as shown in FIG. 1), solder films, solder spheres, partial solder spheres, solder columns, or any other suitable size and shape of solder material. Further, for example, the solder material may include eutectic 63/37 SnPb solder balls or solder spheres, solder paste, or may be formed of lead free solder alloys such as SAC305 (Sn,Ag3.0,Cu0.5).

The encapsulant 58 may include any suitable curable material that provides insulative and structural functionality. For example, such curable material may include UV-curable material or heat-curable material (e.g., epoxy materials), or any other curable materials (e.g., acrylic materials). Further, for example, the curable material may be formed of an epoxy, such as DP-270, DP-100, DP-110, R1133, etc. Generally, thermal characteristics of the cured encapsulant is preferably like those of the substrate materials used for the interconnect device 20 and the high density interconnect board 22 (e.g., similar thermal expansion coefficients).

After the surface mount adapter apparatus 10 is provided according to, for example, method 200 as shown in FIG. 3, the surface mount adapter apparatus 10 may be mounted to the target board 12 by connecting the first plurality of conductive pads 44 to the pattern of conductive pads 13 of the target board 12. For example, such an electrical connection may be provided using a solder connection. Alternatively, such an electrical connection may be provided by a conductive epoxy or any other suitable conductive connection material.

With the surface mount adapter apparatus 10 mounted on the target board 12, a carrier adapter, such as carrier adapter 14, may be removably connected to the surface mount adapter apparatus 10 using the second ends 62 of the interconnect elements 26. In such a fashion, the carrier adapter 14 may receive a packaged device, such as a MLF device, and mounting of the MLF device relative to the target board 12 is accomplished.

FIGS. 4A-4D show a partial cut-away side view, a top view, a side view, and a bottom view, respectively, of one exemplary embodiment of a surface mount adapter apparatus 300 including female socket pins according to the present invention. FIG. 5 shows a more detailed diagrammatic cross-sectional view of the surface mount adapter apparatus 300 shown in FIGS. 4A-4D, as well as a target board 12 including a pattern of conductive pads 13 configured thereon for receiving a packaged device (e.g., a MLF device). The surface mount adapter apparatus 300 includes interconnect device 320 and a high density interconnect board 322.

The high density interconnect board 322 includes a first side 340 including a plurality of conductive pads 372 configured thereon to correspond to the pattern of conductive pads 13 on target board 12 (e.g., the same configuration as conductive pads of a packaged device which was to be mounted on the pattern of conductive pads 13 of the target board 12). The conductive pads 372 on the lower surface or first side 340 of the high density interconnect board 322 are connected or routed to conductive pads 374 on the second side 342 of the high density interconnect board 322 by blind and buried vias as generally represented by single via 350 (see FIG. 5). One will recognize that such routing by blind and buried vias (e.g., micro-vias) is known in the art and will not be described in any further detail herein. The ground pad 345 is also routed to a female socket terminal pin 346, as well as the other conductive pads 372.

The interconnect device 320 which is electrically connected to the high density interconnect board 322 (e.g., which also provides a mechanical coupling therebetween) includes a substrate 324 having a first side 330 and an opposite second side 332. A plurality of openings 348 are defined through the substrate 324 from first side 330 to the second side 332 thereof.

The interconnect device 320 further includes a plurality of female socket terminal pins 326. Each female socket terminal pin 326 includes a body member 361 that extends from a first end 360 to a second end 362. The second end 362 at the second side 332 of the interconnect device 320 is accessible for receiving a mating male pin or any other suitable interconnect or connector apparatus, or testing device. The first end 360 of the female socket terminal pin 326 is electrically connected to a corresponding conductive pad 374 on the second surface 342 of the high density interconnect board 322.

As shown in FIG. 5, such an electrical connection is accomplished with a reflowed solder connection 352. For example, such a connection may be made by positioning solder spheres between the conductive pads 374 and first end 360 of female socket terminal pins 326 followed by subsequent reflow (e.g., thermal treatment).

Each of the female socket terminal pins 326 may include a receptacle clip 327 that accepts and mates with a terminal male pin. Further, an encapsulant 358 is provided between the interconnect device 320 and the high density interconnect board 322 (e.g., between the second side 342 of the high density interconnect board 322 and the first side 330 of the interconnect device 320).

Figure 6B:
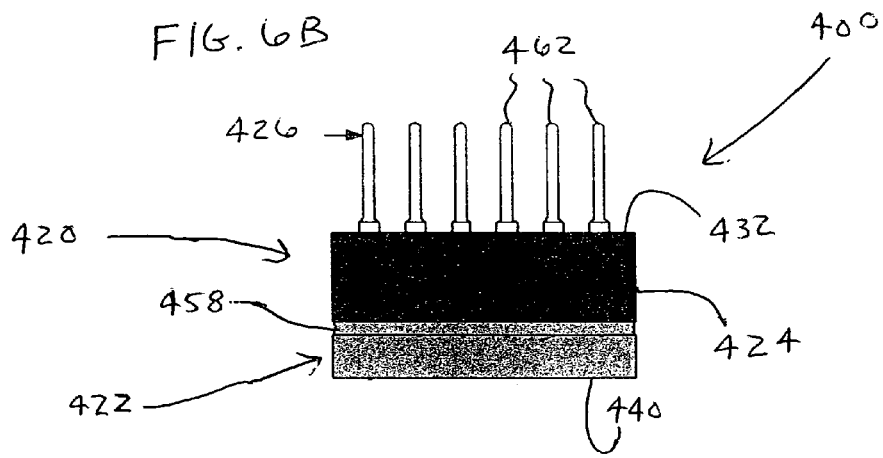
FIGS. 6A-6C show a partial cut-away side view, a side view, and a bottom view, respectively, of one exemplary alternate embodiment of a surface mount adapter apparatus according to the present invention.
Figure 6A:
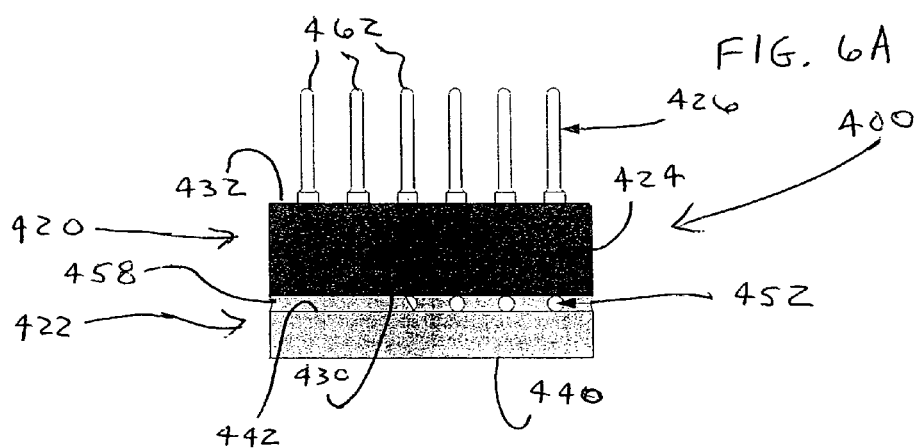
Figure 6C:
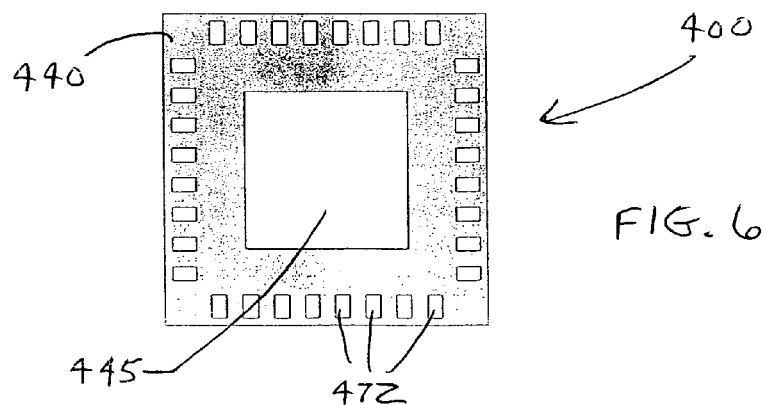

FIGS. 6A-6C show a partial cut-away side view, a side view, and a bottom view, respectively, of one exemplary embodiment of a surface mount adapter apparatus 400 including male terminal pins 426 according to the present invention. FIG. 7 shows a more detailed diagrammatic cross-sectional view of the surface mount adapter apparatus 400 shown in FIGS. 6A-6C, as well as a target board 12 including a pattern of conductive pads 13 configured thereon for receiving a packaged device (e.g., a MLF device). The surface mount adapter apparatus 400 includes interconnect device 420 and a high density interconnect board 422.

The high density interconnect board 422 includes a first side 440 including a plurality of conductive pads 472 configured thereon to correspond to the pattern of conductive pads 13 on target board 12 (e.g., the same configuration as conductive pads of a packaged device which was to be mounted on the pattern of conductive pads 13 of the target board 12). The conductive pads 472 on the lower surface or first side 440 of the high density interconnect board 422 are connected or routed to conductive pads 474 on the second side 442 of the high density interconnect board 422 by blind and buried vias as generally represented by single via 450 (see FIG. 7). One will recognize that such routing by blind and buried vias (e.g., micro-vias) is known in the art and will not be described in any further detail herein. The ground pad 445, as well as the other conductive pads 472, are routed to male terminal pins 426.

The interconnect device 420 which is electrically connected to the high density interconnect board 422 includes a substrate 424 having a first side 430 and an opposite second side 432. A plurality of openings 448 are defined through the substrate 424 from first side 430 to the second side 432 thereof.

The interconnect device 420 further includes a plurality of male terminal pins 426. Each male terminal pin 426 includes a body member 461 that extends from a first end 460 to a second end 462. The second end 462 at the second side 432 of the interconnect device 420 is accessible for mating with a female receptacle or any other suitable interconnect or connector apparatus, or testing device. The first end 460 of the male terminal pin 426 is electrically connected to a corresponding conductive pad 474 on the second surface 442 of the high density interconnect board 422.

As shown in FIG. 7, such an electrical connection is accomplished with a reflowed solder connection 452. For example, such a connection may be made by positioning solder spheres between the conductive pads 474 and first end 460 of male terminal pins 426 followed by subsequent reflow (e.g., thermal treatment). Further, an encapsulant 458 is provided between the interconnect device 420 and the high density interconnect board 422 (e.g., between the second side 442 of the high density interconnect board 422 and the first side 430 of the interconnect device 420).

All patents, patent documents, and references cited herein are incorporated in their entirety as if each were incorporated separately. This invention has been described with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the invention, will be apparent to persons skilled in the art upon reference to this description.

What is claimed is:

1. A surface mount adapter apparatus comprising:

a high density interconnect board comprising first and second sides, wherein the high density interconnect board further comprises a first plurality of conductive pads configured on the first side of the high density interconnect board electrically connected using blind and buried vias with a second plurality of conductive pads configured on the second side of the high density interconnect board, wherein the first plurality of conductive pads are configured for connection to a pattern of conductive pads of a target board, the pattern of the conductive pads of the target board configured to receive a packaged device; and an interconnect device comprising a substrate having first and second sides and a plurality of interconnect elements extending through the substrate, wherein each of the plurality of interconnect elements comprises at least a first end and a second end, wherein the interconnect device is electrically connected to the high density interconnect board with the second side of the high density interconnect board adjacent the first side of the interconnect device, the first end of each of one or more of the plurality of interconnect elements being electrically connected to one of the second plurality of conductive pads on the second side of the high density interconnect board, wherein the high density interconnect board and the interconnect device are configured to have a footprint substantially the same as the packaged device.

2. The adapter apparatus of claim 1, wherein each of one or more of the plurality of interconnect elements extending through the substrate are press-fit into a corresponding opening defined through the substrate of the interconnect device.

3. The adapter apparatus of claim 1, wherein each of one or more of the plurality of interconnect elements extending through the substrate are mounted within a corresponding opening defined through the substrate of the interconnect device using a curable material.

4. The adapter apparatus of claim 1, wherein the first end of each of one or more of the plurality of interconnect elements is electrically connected to one of the second plurality of conductive pads on the second side of the high density interconnect board by a reflowed solder connection.

5. The adapter apparatus of claim 1, wherein at least one of the plurality of interconnect elements comprises a female socket pin, a male terminal pin, or a conductive element comprising two ends configured to receive solder material on at least one of the ends.

6. The adapter apparatus of claim 5, wherein at least one of the plurality of interconnect elements comprises a female socket pin.

7. The adapter apparatus of claim 1, wherein the first plurality of conductive pads configured on a first side of the high density interconnect board are configured for connection to a pattern of conductive pads of a target board, the pattern of conductive pads of the target board configured to receive a micro lead frame package or any other chip scale package.

8. The adapter apparatus of claim 1, wherein the first plurality of conductive pads of the high density interconnect board are electrically connected with the second plurality of conductive pads of the high density interconnect board using blind and buried micro-vias.

9. The adapter apparatus of claim 8, wherein the first plurality of conductive pads configured on a first side of the high density interconnect board are configured for connection to a pattern of conductive pads of a target board, the pattern of conductive pads of the target board configured to receive a micro lead frame package or any other chip scale package.

10. The adapter apparatus of claim 1, wherein an encapsulant is provided between the second side of the high density interconnect board and the first side of the interconnect device.

11. The adapter apparatus of claim 1, wherein a carrier adapter is configured for connection via the seconds ends of the plurality of interconnect elements to the surface mount adapter apparatus, wherein the carrier adapter is used to connect a micro lead frame package or any other chip scale package to the surface mount adapter apparatus.

\* \* \* \* \*